(12) United States Patent
Chen et al.

(10) Patent No.: US 9,318,476 B2
(45) Date of Patent: Apr. 19, 2016

(54) HIGH PERFORMANCE STANDARD CELL WITH CONTINUOUS OXIDE DEFINITION AND CHARACTERIZED LEAKAGE CURRENT

(71) Applicant: QUALCOMM Incorporated, San Diego, CA (US)

(72) Inventors: Xiangdong Chen, Irvine, CA (US); Ohsang Kwon, San Diego, CA (US); Foua Vang, Lemon Grove, CA (US); Animesh Datta, San Diego, CA (US); Seid Hadi Rasouli, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 149 days.

(21) Appl. No.: 14/195,525

(22) Filed: Mar. 3, 2014

(65) Prior Publication Data

US 2015/0249076 A1   Sep. 3, 2015

(51) Int. Cl.
| | |
|---|---|
| *H01L 27/02* | (2006.01) |
| *H01L 27/088* | (2006.01) |
| *H01L 21/768* | (2006.01) |
| *H01L 21/8234* | (2006.01) |
| *H01L 27/118* | (2006.01) |

(52) U.S. Cl.
CPC ...... *H01L 27/0207* (2013.01); *H01L 21/76895* (2013.01); *H01L 21/823437* (2013.01); *H01L 21/823475* (2013.01); *H01L 27/088* (2013.01); *H01L 27/11807* (2013.01); *H01L 21/823412* (2013.01); *H01L 21/823481* (2013.01); *H01L 2027/11831* (2013.01); *H01L 2027/11861* (2013.01); *H01L 2027/11866* (2013.01)

(58) Field of Classification Search
None
See application file for complete search history.

(56) References Cited

U.S. PATENT DOCUMENTS

| | | | |
|---|---|---|---|
| 5,360,757 A | 11/1994 | Lage | |
| 7,681,164 B2 | 3/2010 | Lin et al. | |
| 7,920,403 B2 | 4/2011 | Liaw | |
| 8,120,939 B2 | 2/2012 | Liaw | |
| 8,138,554 B2 | 3/2012 | Chuang et al. | |
| 2004/0213029 A1* | 10/2004 | Hirata | G11C 17/12 365/104 |
| 2006/0040460 A1 | 2/2006 | Kakimura et al. | |
| 2008/0283871 A1* | 11/2008 | Hamada | H01L 27/0207 257/204 |
| 2009/0140437 A1* | 6/2009 | Saeki | H01L 21/28273 257/776 |
| 2009/0180306 A1* | 7/2009 | Terada | G11C 5/063 365/72 |
| 2010/0059825 A1 | 3/2010 | Yeric et al. | |
| 2010/0078725 A1 | 4/2010 | Hou et al. | |
| 2010/0117120 A1 | 5/2010 | Yamashita | |

(Continued)

FOREIGN PATENT DOCUMENTS

| | | |
|---|---|---|
| EP | 0788166 A2 | 8/1997 |
| EP | 2341537 A2 | 7/2011 |

OTHER PUBLICATIONS

International Search Report and Written Opinion—PCT/US2015/016690—ISA/EPO—Jul. 2, 2015.

(Continued)

*Primary Examiner* — Michael Jung
(74) *Attorney, Agent, or Firm* — Haynes and Boone, LLP

(57) ABSTRACT

A transistor cell is provided that includes a dummy gate overlaying a continuous oxide definition (OD) region. A first portion of the OD region adjacent a first side of the dummy forms the drain. The cell includes a local interconnect structure that couples the dummy gate and a portion of the OD region adjacent a second opposing side of the dummy gate to a source voltage.

14 Claims, 8 Drawing Sheets

(56) References Cited

U.S. PATENT DOCUMENTS

| | | | |
|---|---|---|---|
| 2010/0244142 A1* | 9/2010 | Katakura | H01L 27/0207 257/369 |
| 2011/0241126 A1 | 10/2011 | Herberholz | |
| 2012/0211837 A1 | 8/2012 | Baars et al. | |
| 2013/0020707 A1 | 1/2013 | Or-Bach et al. | |
| 2013/0113520 A1 | 5/2013 | Chen et al. | |
| 2013/0170275 A1 | 7/2013 | Kumar et al. | |
| 2013/0207199 A1 | 8/2013 | Becker et al. | |
| 2013/0242633 A1 | 9/2013 | Liaw | |
| 2014/0151810 A1* | 6/2014 | Maeda | H01L 29/41791 257/365 |
| 2014/0264610 A1* | 9/2014 | Yang | H01L 29/6681 257/368 |
| 2014/0264629 A1 | 9/2014 | Zhu et al. | |

OTHER PUBLICATIONS

Moroz V., et al., "Stress-Aware Design Methodology", Quality Electronic Design, 2007. ISQED'06. 7th International Symposium on, IEEE, Piscataway, NJ, USA,IEEE, Mar. 27, 2006, pp. 1-6, XP002681767, ISBN: 978-0-7695-2523-5 the whole document.

Yeh K-L., et al., "The Impact of Layout-Dependent STI Stress and Effective Width on Low-Frequency Noise and High-Frequency Performance in Nanoscale nMOSFETs", IEEE Transactions on Electron Devices. IEEE Service Center. Pisacataway, NJ, US, vol. 57. No. 11, Nov. 2010, pp. 3092-3100, XP011319392, ISSN: 0018-9383 the whole document.

\* cited by examiner

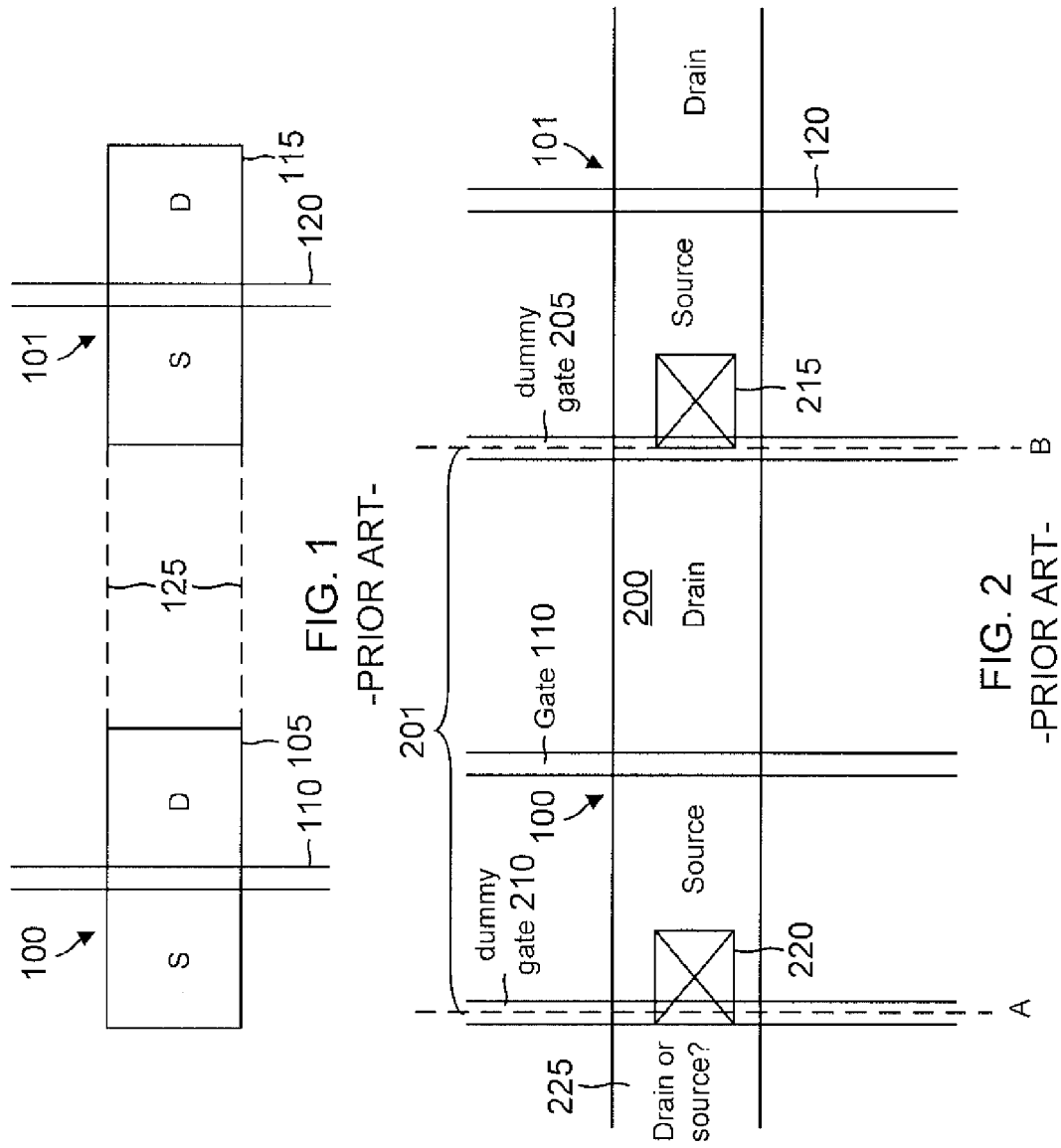

HIGH PERFORMANCE STANDARD CELL WITH CONTINUOUS OXIDE DEFINITION AND CHARACTERIZED LEAKAGE CURRENT

TECHNICAL FIELD

This application relates to processors, and more particularly, to power optimization for processors.

BACKGROUND

As semiconductor technology advances into the deep submicron process nodes, short channel effects can severely degrade performance. The carrier velocity saturates in such short channels, which slows switching speeds and reduces transistor strength. To achieve high density yet have adequate transistor strength, strain engineering techniques have been developed so that the crystal lattice is strained in the source and drain diffusion regions (these diffusion regions are typically denoted as oxide definition (OD) with regard to transistor layout terminology). The OD is not only doped n-type or p-type as appropriate to achieve the desired transistor type (NMOS or PMOS), but is also strained to increase carrier velocity and transistor strength. In that regard, the OD is just locally strained as opposed to straining the entire substrate.

Such local strain has proven to be superior to a global strain across the entire substrate. The type of strain depends upon the transistor type. The OD for PMOS transistors is compressively strained whereas the OD for NMOS transistors has tensile strain. For example, a film of SiGe may be applied to p-type OD to introduce compressive strain whereas a film of SiN or SiC may be applied to n-type OD to introduce tensile strain. The resulting strain engineering of silicon has proven to be quite successful for the achievement of satisfactory transistor strength in deep sub-micron process nodes.

The use of strain engineering introduces a number of constraints into the layout process. FIG. 1 illustrates the layout for an example pair of transistors. A first transistor 100 has its source (S) and drain (D) defined by a first OD region 105. A polysilicon gate 110 separates the source and drain regions. A similar arrangement of another OD region 115 and polysilicon gate 120 defines another transistor 101. At advanced process nodes, the layout of FIG. 1 would be inefficient because OD 115 and 110 forming the drain and source regions are both relatively short. Such a short length to the OD allows its crystal lattice to relax too much despite the use of local strain engineering. Transistors 100 and 101 would thus be too weak. In contrast, if ODs 105 and 115 could be extended to form a continuous OD as shown by the dotted lines 125, ODs 105 and 115 could have increased strain, resulting in better performance. But such an extension of the ODs would short the drain of transistor 100 to the source of transistor 101.

To achieve satisfactory transistor performance in the deep sub-micron process nodes, "continuous OD" layouts have been developed. FIG. 2 illustrates an example layout for a continuous OD 200. Transistors 100 and 101 are still defined with respect to polysilicon gates 110 and 120, respectively. But OD 200 is continuous for both transistors such that it can develop adequate lattice strain for satisfactory transistor strength. A dummy polysilicon gate 205 electrically isolates transistors 100 and 101 by being configured to be charged to the source voltage. For example, if OD 200 is doped p-type, dummy gate 205 would be tied to the power supply voltage VDD. Alternatively, if OD 200 is doped n-type, dummy gate 205 would be tied to ground. A similar dummy gate 210 isolates transistor 100 from a transistor (not illustrated) to the left of dummy gate 210 in continuous OD 200.

Although the use of continuous OD 200 enables sufficient crystal lattice strain to be achieved, there are a number of design complications. For example, each transistor may be considered to reside within a separate "standard cell." A standard cell 201 that forms transistor 100 extends from a border A along dummy gate 210 to a border B along dummy gate 205. Each dummy gate is always tied to a source voltage—in a PMOS embodiment, the source voltage is VDD whereas it is ground in an NMOS embodiment. An interconnect 215 provides the source voltage coupling between dummy gate 205 and the source of transistor 101. Similarly, an interconnect 220 provides the source voltage coupling between dummy date 210 and the source of transistor 100. With this standard cell topology in mind, note the problems that arise with regard to characterizing the leakage for standard cell 201. With regard to the leakage from the drain for transistor 100, it can only be defined at the cell level with regard to the leakage across gate 110 from the source for transistor 100. But this leakage current from the source for transistor 100 in turn depends upon the state for diffusion region 225 to the left of dummy gate 210. A priori, before standard cell 201 is instantiated next to another standard cell, it cannot be known whether diffusion region 225 is the source or the drain for another transistor in this additional standard cell. This uncertainty greatly complicates the leakage calculation for transistor 100. For example, suppose diffusion region 225 forms another transistor source—it will then be at the same voltage as the source for transistor 100 such that no leakage can occur across dummy gate 210. Conversely, if diffusion region 225 forms another transistor drain, then a leakage current will flow from the source for transistor 101 to diffusion region 225. We know that a leakage current will always be present across gate 110 between the drain and source for transistor 100. This leakage current may be denoted as the "always-present" leakage current to distinguish it from the "optional" leakage current that depends upon whether diffusion region 225 forms a drain or a source. So there exists two possibilities for a standard cell such as cell 201: just the always-present leakage current or a sum of the always-present leakage current and the optional leakage current. The leakage current characterization is a very important performance hallmark of a design. But the conventional standard cell architecture shown in FIG. 2 for continuous OD 200 greatly complicates the leakage current determination for a given design.

Accordingly, there is a need in the art for improved standard cell continuous OD architectures

SUMMARY

A cell architecture is disclosed which provides a consistent leakage current characterization for continuous oxide definition (OD) region processes. In that regard, a "cell" refers to the layout for a circuit building block such as a logic gate or an inverter. Such a circuit building block typically comprises several transistors but embodiments disclosed herein may also include just one transistor. A conventional cell may be deemed to extend from a first dummy gate across to a second dummy gate. Within the dummy gate boundaries, there may be one or more gates, depending upon the number of transistors. Similarly, one or more continuous OD regions may extend across the cell. These continuous OD regions may also be denoted as continuous active regions. For example, if a cell is to contain both NMOS and PMOS transistors, it would need at least two continuous OD regions—at least one doped p-type active region for the PMOS transistors and at least one doped n-type active region for the NMOS transistors. In a conventional cell, the cell structures would stop at the dummy gate boundaries. But the advantageous cell disclosed herein demands an extension beyond the dummy gate adjacent the transistor's drain. In that regard, the transistor has a drain and a source each defined in the OD region so as to be separated by the transistor's gate. The drain is thus defined in a portion of the OD region that stretches from the gate to a first side of the adjacent dummy gate. This adjacent dummy gate to the drain may also be denoted herein as the drain-side dummy gate. The remaining dummy gate may thus be denoted as the source-side dummy gate.

The drain-side dummy gate includes an opposing second side. In a conventional cell, there is no structure that carries over to a portion of the OD region adjacent this opposing second side of the drain-side dummy gate. But as will be explained further below, the cell discussed herein includes a local interconnect structure that couples the drain-side dummy gate and the portion of the OD region adjacent the opposing second side of the drain-side dummy gate to a source voltage. This is quite advantageous because the drain for the cell is guaranteed to always be separated by the drain-side dummy gate from a portion of the OD region charged to the source voltage. Note that the OD region including the cell will typically including numerous other cells. These cells may be deemed to extend from a first cell to a last cell. But even if the cell is the last cell (or the first cell) such that there would be no further cells defined in the portion of the OD region adjacent the second side of the drain-side dummy gate, this portion of the OD region will act no differently from a transistor source with regard to the leakage current that flows from this portion of the region across the drain-side dummy gate to the drain. In other words, there may be a cell defined in this portion of the OD region or there may not be. Regardless of whether there is another cell adjacent the drain-side dummy gate, the portion of the OD region adjacent the second side of the drain-side dummy gate is charged to the source voltage.

Given this cell architecture, the uncertainty discussed above with regard to conventional continuous OD cell leakage has been alleviated. The resulting cell always provides a consistent, predictable leakage. In that regard, note that the cell requires no local interconnect extension beyond the source-side dummy gate to the continuous OD region outside of the source-side dummy gate. It may be that an additional cell is defined in this portion continuous OD region to have a drain. It is true that leakage current will flow from the source of the present cell to the drain of this additional cell. But such an additional leakage current does not upset the leakage current characterization at the cell level because this additional cell has the same structure and thus measures this leakage current as its own. Conversely, if this neighboring cell abuts with its source, there is no leakage current between the neighboring cells due to the source-to-source abutment.

BRIEF DESCRIPTION OF THE DRAWINGS

FIG. 1 illustrates a conventional pair of transistor having non-continuous diffusion regions.

FIG. 2 illustrates a conventional pair of transistors in a continuous diffusion region.

DETAILED DESCRIPTION

To meet the need in for continuous OD standard cells with predictable leakage currents, a variety of continuous OD standard cell architectures are disclosed that provide a known amount of leakage current. In other words, the uncertainty discussed above with regard to the conventional layout shown in FIG. 2 is eliminated. This is remarkably advantageous as one can then confidently predict the leakage current just from the number of standard cells that a design incorporates. In contrast, the leakage current from a circuit constructed using conventional standard cell 201 of FIG. 2 must be determined through simulation as it will depend on the various drain-source or source-to-source cell abutments. In sharp contrast, the leakage current calculation for the disclosed cell does not vary regardless of whether it has a source-to-source or source-to-drain abutment with a neighboring cell. These advantageous features may be better appreciated with a discussion of modern local interconnects.

Referring again to FIG. 2, note that local interconnects 220 and 215 are shown in simplified form. In reality, a variety of local interconnect layouts or structures are known for coupling between gate and non-gate regions. These structures are disclosed herein with regard to a two-layer local interconnect topology (with a third layer dedicated to vias). Although leads in the metal layers adjacent the substrate are also sometimes denoted as "local interconnects," such leads are excluded from the definition of "local interconnect" as used herein. In older process nodes, interconnects in the first metal layer (and higher metal layers) would couple to the transistor gates and drain/source terminals through vias. But as semiconductor processing technology advanced into the deep sub-micron region, the vias from the first metal layer (or higher layers) couple to these transistor structures through a two-layer local interconnect structure. The vias are thus in an upper third layer (level 3) between the two lower layers of local interconnect (levels 1 and 2).

Figure 3:
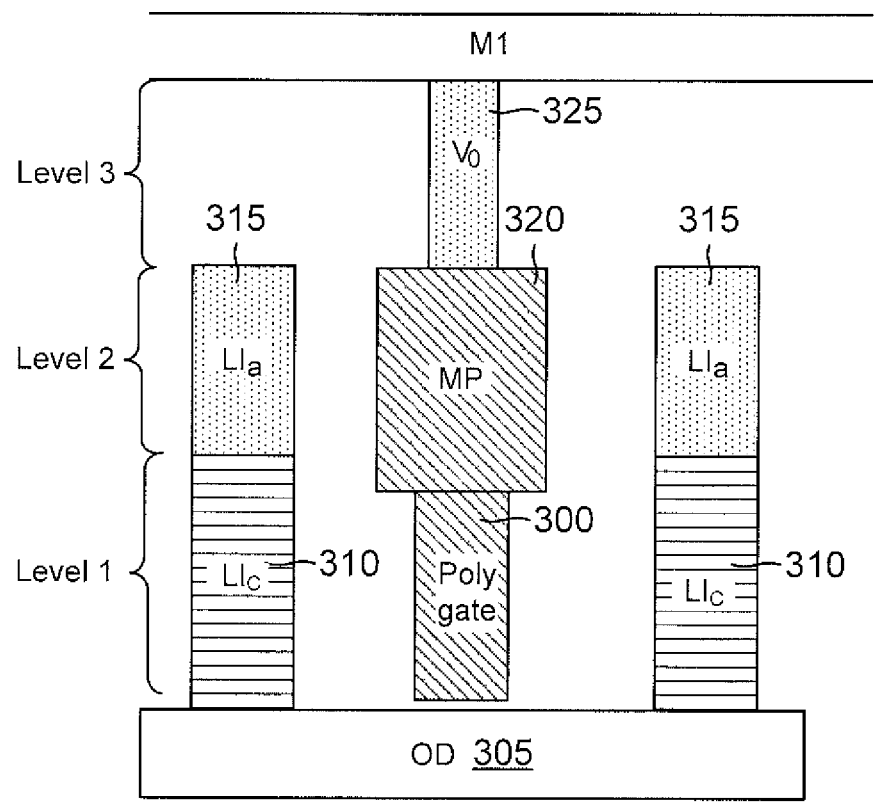
FIG. 3 is a cross-sectional view of multi-level local interconnects and associated structures.

Some example two-level local interconnects are shown in FIG. 3. As can be seen in this figure, there are three levels of local interconnects, ranging from level 1 to level 3. Level 1 defines a layer of local interconnects adjacent a continuous diffusion region (OD) 305. Level 3 defines a layer of local interconnects adjacent a first metal layer M1. Finally, level 2 defines a layer of local interconnects that couple between the level 1 and level 3 local interconnects.

A level 1 local interconnect 310 comprises a local interconnect (LI) type denoted as LIc. There are two types of local interconnect in level 2: LIa 315 and LIb 320. There is thus one type (LIc 310) in level 1 whereas there are two types (LIa 315 and LIb 320) in level 2. A level 1 interconnect such as LIc 310 directly couples to continuous diffusion region 305. Such a level 1 interconnect would thus be applied through an appropriate semiconductor processing mask to continuous diffusion region (OD) 305 prior to the formation of any level 2 interconnects. Level 1 is also the level for a gate layer 300 such as a polysilicon layer or a high-K metal layer. Gate layer 300 is not a form of local interconnect as it forms a gate for a transistor having a source, drain, and channel in continuous diffusion region 305. Level 2 interconnects such as LIa 315 and LIb 320 couple to first metal layer M1 (or higher metal layers) through vias such as a via V0 325. The vias are arranged in level 3 between level 2 and the first metal layer M1.

Referring back to FIG. 2, the footprints for gate layers 110, 120, and 205 form relatively narrow polygons having a longitudinal axis that is orthogonal to a longitudinal axis for the polygonal footprint for continuous diffusion region 200. The local interconnects follow such an organization: a given type of local interconnect will generally be arranged so to have a polygonal shape having a longitudinal axis that is parallel to either the gate layer or the continuous diffusion region (i.e., to have a polygonal footprint with a longitudinal axis that is parallel to a longitudinal axis for the polygonal footprint for either the gate layer or the continuous diffusion region). Since it is cumbersome to repeatedly refer to the longitudinal axis of a polygonal shape used for layout purposes, a local interconnect is defined herein to be a "gate-directed local interconnect" if its polygonal footprint has a longitudinal axis parallel to the longitudinal axes for the polygonal footprints of the gate layers. Conversely, a local interconnect is defined herein to be a "diffusion-directed local interconnect" if its polygonal footprint has a longitudinal axis that is parallel to the longitudinal axes of the polygonal footprints of the diffusion regions.

A level 1 local interconnect such as LIc 310 is formed on diffusion region 305. LIc 310 thus acts as the direct electrical coupling to diffusion region 305 with regard to higher layers of interconnects. One can thus immediately appreciate that a level 1 local interconnect must be a gate-directed local interconnect as otherwise it would interfere with the layout for the gate layer 300: LIc 310 cannot be a diffusion-directed local interconnect or it could short to and intersect gate layer 300. In contrast, level 2 local interconnects can be either gate-directed local interconnects or diffusion-directed local interconnects. One level 2 type of local interconnect is necessary for coupling to LIc 310 such as LIa 315. Thus, LIa 315 is a gate-directed local interconnect and couples between a corresponding via (not illustrated) in level 3 to M1 (or higher metal layers). Level 2 LIb 320 couples to gate layer 300 and is arranged to either have a square footprint (deemed herein to be diffusion-directed) or to have a polygonal footprint that is diffusion-directed. LIb 320 may also be denoted herein as "MP" 320. A via V0 coupling between LIb 320 and metal layer M1 is representative of the level 3 interconnects between M1 and the level 1 and level 2 local interconnects. First metal layer M1 lies above level 3. LIa 315, LIb 320, and LIc 310 typically comprise tungsten whereas via V0 and M1 typically comprises copper. Other materials may be used as known in the local interconnect arts.

Figure 4A:
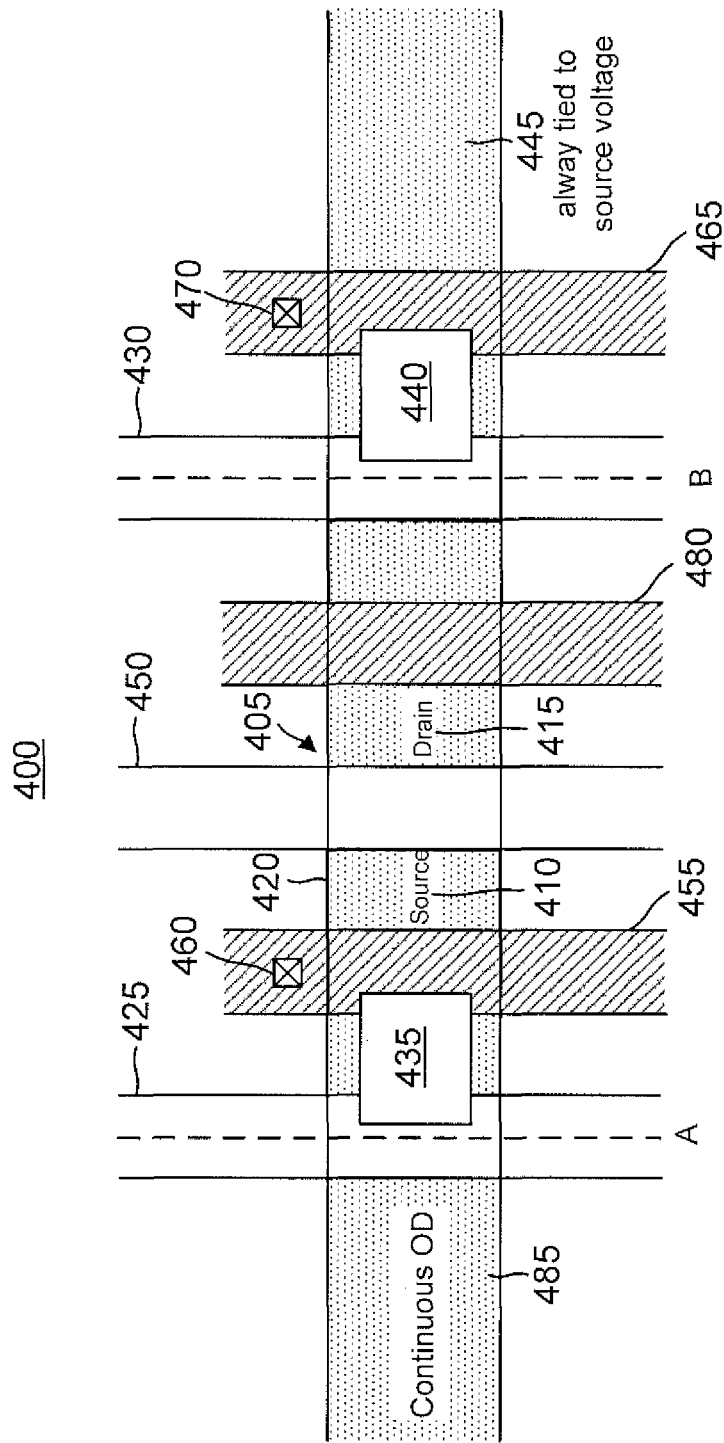
FIG. 4A illustrates a layout for a cell in a continuous diffusion region, wherein a transistor includes a drain adjacent a first side of a dummy gate, and wherein the cell includes a local interconnect structure configured to charge a portion of the diffusion region and the dummy gate to a source voltage.

With these local interconnect concepts in mind, an example standard cell 400 is shown in FIG. 4A. Note that this figure (as is the case for all the other layout figures in this matter) is a plan view. In other words, whereas FIG. 3 was a cross-sectional view of a substrate that included OD 305, FIG. 4A is showing a plan view of the substrate's active surface that supports standard cell 400. In this layout, standard cell 400 includes a transistor 405 having a source 410 and a drain 415 formed in a continuous OD 420. Since OD 420 is continuous, standard cell 400 extends from a first dummy polysilicon gate 425 across a polysilicon gate 450 for transistor 405 to a second dummy gate 430. Note that cell 400 may include additional polysilicon gates such as gate 450 for other transistors. For illustration clarity, cell 400 is thus shown including just one polysilicon gate 450 but it will be appreciated that additional such polysilicon gates may be included in alternative embodiments. Similarly, cell 400 may include additional continuous OD regions besides continuous OD 420. A level 2 MP interconnect 435 couples from first dummy gate 425 through a level 1 LIc interconnect 455 to source 410. A via 460 couples between a metal layer such as the M1 metal layer (not illustrated) to level 1 LIc interconnect 455 through a level 2 interconnect LIa layer (not illustrated) so that source region 410 and dummy gate 425 are charged to the appropriate source voltage (VDD or ground, depending upon whether transistor 405 is a PMOS or NMOS transistor, respectively).

In an analogous fashion to interconnect 435, a level 2 MP interconnect 440 couples from second dummy gate 430 through a level 1 LIc interconnect 465 to a diffusion region 445 in OD 420 to the right of dummy gate 430. Since dummy gate 430 should be tied to a source voltage for it to function as a dummy gate, a via 470 couples between a source interconnect in a metal layer (not illustrated) to level 1 LIc interconnect 465 through a level 2 LIa interconnect (not illustrated). Diffusion region 445 is thus also charged to the source voltage. As discussed previously, both LIc 465 and the LIa interconnect are gate-directed interconnects. In a level 1/level 2 stack of these gate-directed interconnects, the combination of the LIa and LIc interconnects may be designated as an MO_OD layer. For example, an MO-OD layer 480 couples to drain 415.

Note that cell 400 includes MP interconnect 440, LIc interconnect 465, and via 470 even though these structures exist outside a traditional cell boundary, which would conventionally extend from dotted line A on dummy gate 425 to dotted line B on dummy gate 430. These extra structures are quite advantageous because they force diffusion region 445 to always be charged to the source voltage. One can then calculate the leakage current across dummy gate 430 from this extra "source" (diffusion region 445) to drain 415. This leakage current will then be the same for each duplication of cell 400. The vagaries of whether a source or a drain exists in a diffusion region 485 in OD 420 to the left of dummy gate 425 thus doesn't matter because at a cell level the leakage current is always calculated from the extra "source" (diffusion region 445) to the drain 415. Should diffusion region 485 comprise a source for another cell (not illustrated), there then can be no additional leakage current across dummy gate 425 between source/diffusion region 485 and source 410 as these nodes are charged to the same potential. Conversely, should diffusion region 485 comprise a drain for another cell (not illustrated), the leakage current from source 410 to diffusion region 485 would then be captured at the cell level at the drain for this additional cell. This is quite advantageous in that the leakage current can now be characterized at the cell level whereas this was problematic for conventional cell 201 as discussed above. Note how advantageous this is: depending upon the foundry process and cell dimensions, one can always place a range on this defined leakage current for the various expected process corners, supply voltages, and temperatures. Whatever this range is, one then needs to merely multiply it by the number of cells 400 to characterize the leakage current. In contrast, one has no such ready solution for the leakage current for cell 201 of FIG. 2. In particular, interconnect 215 (which as discussed above is shown in simplified form that does not account for the two-level local interconnect structure discussed above) is not part of cell 201. So cell 201 does not offer the certainty cell 400 does with regard to providing a known amount of leakage current.

Note that there is a distinct physical difference between cell 400 and conventional cell 201. For example, suppose that cell 201 were at the edge of a transistor array. In other words, it is known that gates such as gates 110, and 101 (as well as dummy gates 210 and 205) are laid out according to a gate pitch. This pitch defines a regular spacing between adjacent gate structures. An OD diffusion region such as OD 200 thus extends across numerous gates for various cells. The gates are thus arrayed across the extent of a continuous OD diffusion region from one end of the OD diffusion region to a remaining end of the OD diffusion region. The gates may be deemed to be arranged from an initial gate to a final gate with regard to their arrangement according to the gate pitch across the OD diffusion region. Similarly, the transistors corresponding to the gates may also be deemed to be arranged from a starting transistor to a final transistor with regard to any given continuous OD diffusion region. In that regard, suppose transistor 100 of FIG. 2 were the final transistor on continuous OD diffusion region 200. There would then be no transistor 101 to the right of transistor 100. Since interconnect 215 is part of the cell for transistor 101, it would thus be absent were transistor 100 the final transistor on continuous OD diffusion region 200. Dummy gate 205 would thus float in such a conventional case. But cell 400 is quite different—it doesn't matter whether cell 400 is the final cell on continuous OD diffusion region 420 because interconnect 440 and well as interconnect 465 and via 470 are included within cell 400. Dummy gate 430 is thus always charged to the source voltage as well as diffusion region 445 regardless of whether cell 400 is the final cell or an earlier cell.

In one embodiment, the local interconnect structure of diffusion-directed local interconnect 440 and gate-directed local interconnect 465 may be deemed to comprise a means for coupling dummy gate 430 and diffusion region 445 to a source voltage.

As defined herein, the longitudinal axis for OD-aligned structures may be deemed to extend in "a diffusion-directed" direction whereas gate-aligned structures may be deemed to extend in "a gate-aligned" direction that is orthogonal to the diffusion-directed direction. Referring again to cell 400, MP local interconnects 435 and 440 may be deemed to extend in the diffusion-directed direction. For example, interconnect 440 extends in the diffusion-directed direction from dummy gate 430 to level 1 LIc interconnect 465. In contrast, level 1 LIc interconnect 465 plainly extends in the gate-directed direction as it parallels a portion of dummy gate 430.

Figure 4B:
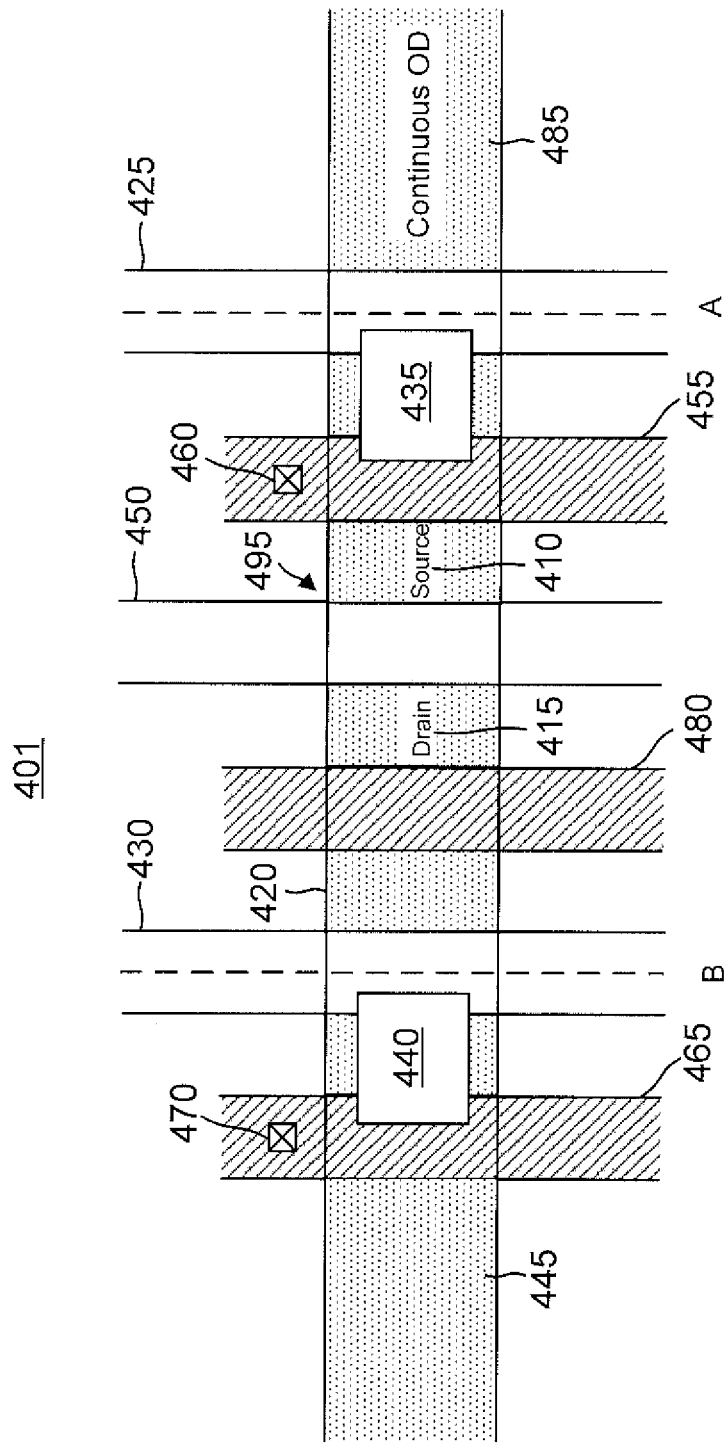
FIG. 4B illustrates a cell having a mirror-image relationship to the cell of FIG. 4B.

The cell architecture shown in FIG. 4A can readily be "flipped" by 180 degrees as shown in FIG. 4B for cell 401 including a transistor 495. In other words, whereas cell 400 has its source 410 on the left of gate 450 and its drain on the right of gate 450, source 410 for cell 401 is on the right of gate 450. Similarly, drain 415 is to the left of gate 450 in cell 401. Cell 400 and cell 401 are thus mirror images of each other. The remaining structures in cell 401 follow this mirror-image relationship and are otherwise as discussed with regard to cell 400. For example, whereas interconnect 465 was to the right of gate 450 in cell 400, interconnect 465 is to the left of gate 450 in cell 401. One can thus appreciate that cell 401 may abut to another cell 401, or a cell 400 at either boundary A or B. Similarly, cell 400 may about to other cells 400 at boundaries A and B or to cells 401. Regardless of the abutment, the leakage current for cells 400 and 401 may always be advantageously characterized at the cell level. As discussed with regard to cell 400, cell 401 includes just one polysilicon gate 450 and one continuous OD 445 but it will be appreciated that alternative cell architectures may include multiple gates and continuous OD regions.

Figure 5A:
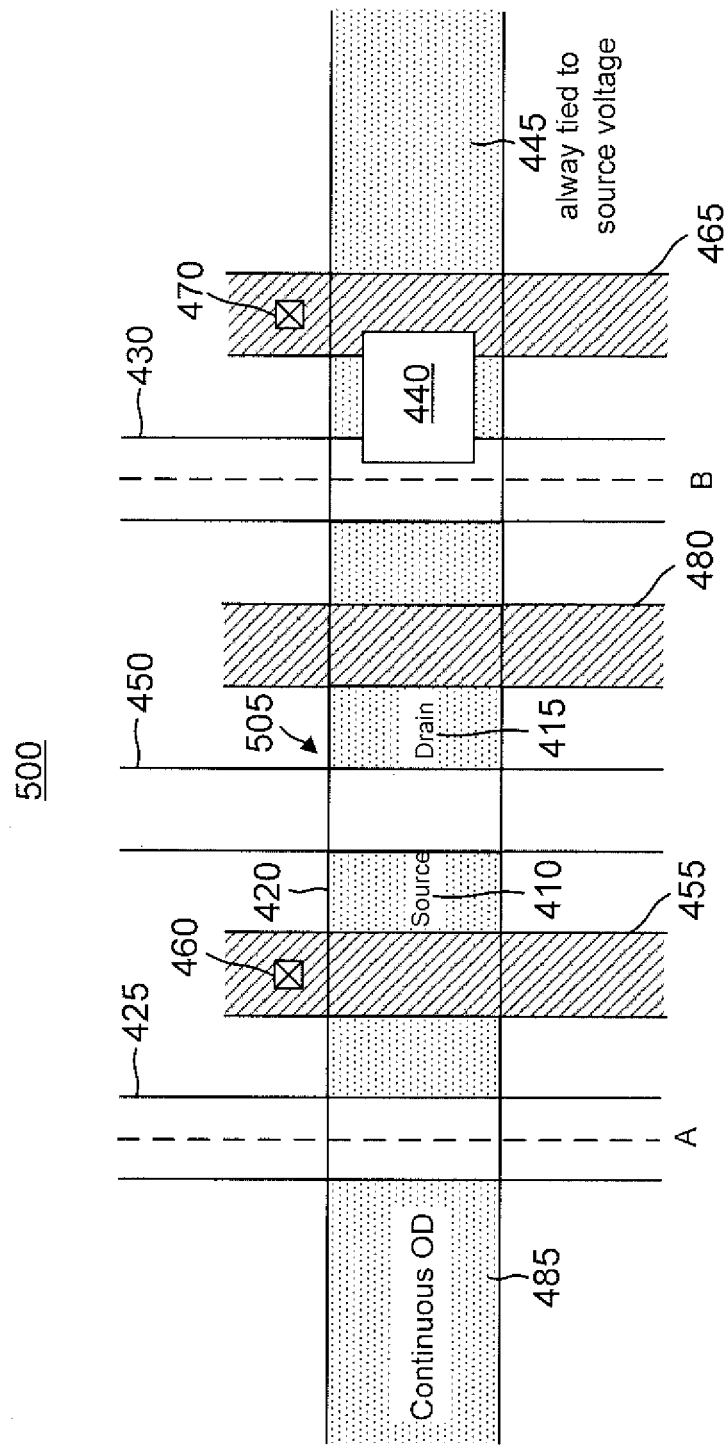
FIG. 5A illustrates a variation of the cell architecture of FIG. 4A in which an additional dummy gate is floating.
Figure 5B:
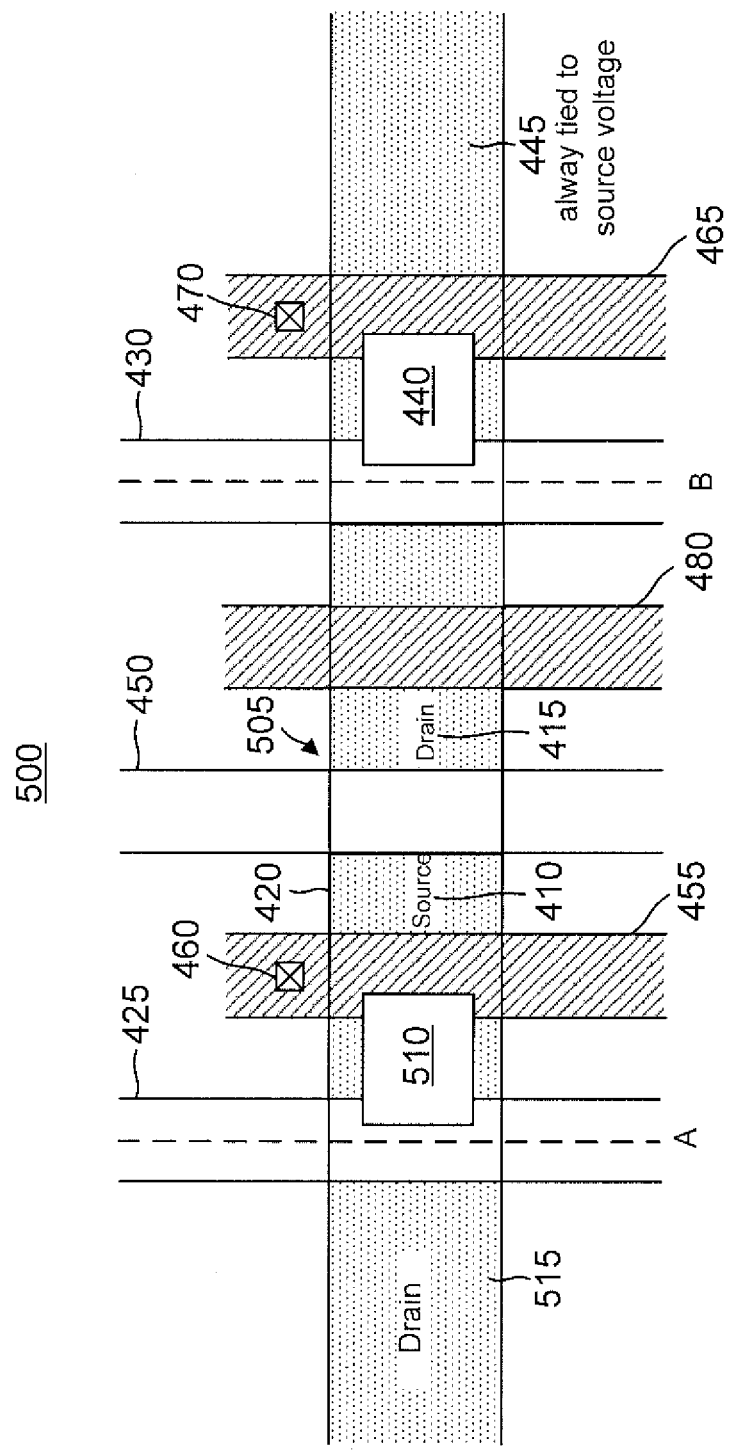
FIG. 5B illustrates the cell of FIG. 5A abutting a drain of a transistor in a neighboring cell.

An alternative cell architecture is shown for a cell 500 in FIG. 5A. The difference between cell 500 and cell 400 is that MP interconnect 435 is absent. Otherwise, the structures in cell 500 are as discussed with regard to cell 400. The result is that dummy gate 425 is floating. But this causes no concern since dummy gate 425 will be appropriately charged after abutment with another cell. For example, if another transistor (not illustrated) in a cell having the same structure of cell 500 (although it may have varying numbers of polysilicon gates and continuous OD regions) has its drain 515 adjacent to dummy gate 425 as shown in FIG. 5B, then this additional transistor requires the addition of a level 2 diffusion-directed interconnect 510 coupling dummy gate 425 to level 1 gate-directed interconnect 455 just as cell 500 requires level 2 diffusion-directed interconnect 440 to couple to level 1 gate-directed interconnect 465. Note that the purpose of interconnect 440 is to ensure that OD portion 445 adjacent second dummy gate 430 is tied to the source voltage since second dummy gate 430 is adjacent the drain for transistor 505. In this fashion, the leakage current for cell 500 can be characterized regardless of whether drain 515 were instead a source. The leakage from source 410 to drain 515 will then be captured in the cell (not illustrated) for the transistor including drain 515. If this additional cell instead had a source where drain 515 is shown, then there would be no leakage between source 410 and this other source. One can thus appreciate that the leakage at the cell level for cell 500 (and also for cells 400 and 401) is the same regardless of the adjacent cell abutment (source or drain). An example method of manufacture will now be discussed for these advantageous cell structures.

Example Method of Leakage Current Analysis and Manufacture

As discussed above, circuit design and analysis is greatly simplified with the innovative cell designs disclosed herein. Like conventional cell architectures, these cell designs isolate their transistors using dummy gates. In particular, cell includes a drain that is adjacent a first side of a first dummy gate. Similarly, the cell includes a source that is adjacent a second dummy gate. The cell's gate lies between the drain and source. Such structures are conventional. But what is not conventional is that the cell includes a local interconnect structure that extends from the first dummy gate so that both the first dummy gate and a portion of the OD region adjacent a second opposing side of the first dummy gate are charged to a source voltage. This guarantees a predictable leakage current for every cell: with regard to a single OD region, it is the leakage current from this source-charged portion of the OD region to the cell's drain across that OD region. Depending upon the number of OD regions extending across a cell, one can thus predict the leakage current accordingly. Given this guarantee, there is no concern as to whether a source or drain abuts the cell drain. If an additional cell's source abuts the cell's source, no additional leakage current occurs. If an additional cell's drain abuts the cell's source, this neighboring additional cell will "capture" the leakage current that would flow from the cell to the additional cell's drain. In this fashion, a circuit designer need merely calculate what the leakage current is for a particular instantiation of the cell. This calculation is a routine one as known in the art and would depend upon the transistor dimensions and expected semiconductor corner. There would of course be some tolerance in such a calculation as the exact process corner cannot be known until after manufacture. But this tolerance is the same for all the cells. The leakage calculation thus become relatively effortless: one need only count the cells that extend across a given OD region and multiply the resulting number by the expected cell leakage.

Figure 6:
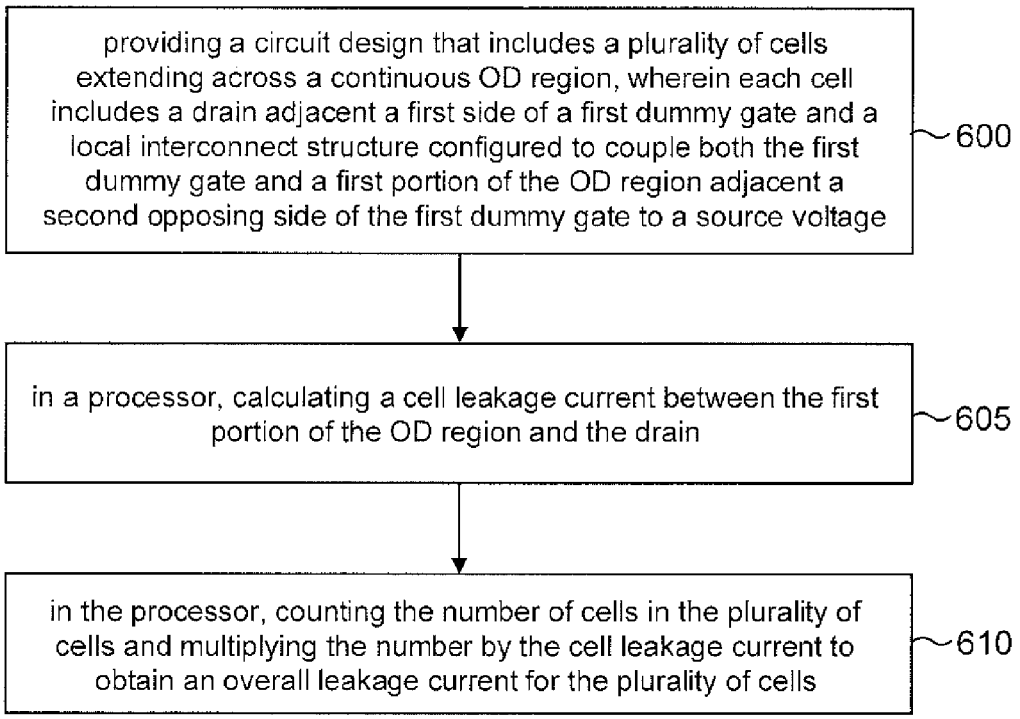
FIG. 6 is a flowchart for an example leakage current analysis of cells in accordance with the disclosure.

The flowchart of FIG. 6 summarizes this advantageous leakage current analysis method. The analysis may be performed using a processor (not illustrated). The method begins with a step 600 of designing a circuit that includes a plurality of cells extending across a continuous OD region, wherein each cell includes a drain adjacent a first side of a first dummy gate and a local interconnect structure configured to couple both the first dummy gate and a first portion of the OD region adjacent a second opposing side of the first dummy gate to a source voltage. The method includes an act 605 of calculating, in a processor, a cell leakage current between the first portion of the OD region and the drain. Finally, the analysis includes an act 610 of, in the processor, counting the number of cells in the plurality of cells and multiplying the number by the cell leakage current to obtain an overall leakage current for the plurality of cells.

In an additional step (not illustrated) the plurality of cells and the corresponding OD region may be formed in a semiconductor substrate to complete the manufacture. But note that the leakage current analysis is greatly simplified in that it merely requires a counting of the cells and multiplying the count by the cell leakage current. But that is not the case with conventional cells because the unknown abutment of a conventional cell's drain to another conventional cell's drain or source. Accordingly, the disclosed cell architecture greatly simplifies circuit design and analysis.

Figure 7:
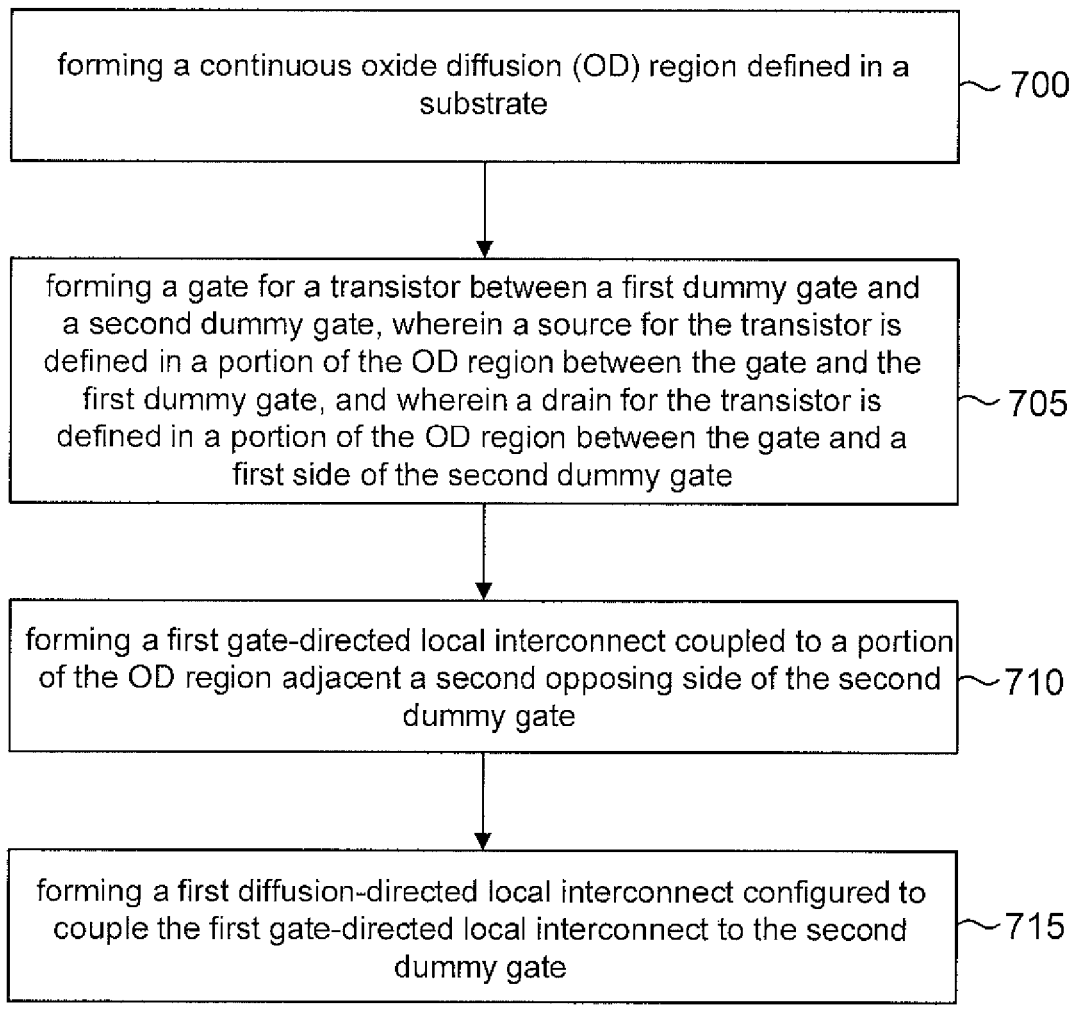
FIG. 7 is a flowchart for an example method of manufacture for the cells of FIGS. 4A through 5B.

An example method of manufacture for a cell in accordance with the disclosure is provided in FIG. 7. In an initial step 700, a continuous oxide definition (OD) region is defined in a substrate. A step 705 comprises forming a gate for a transistor between a first dummy gate and a second dummy gate, wherein a source for the transistor is defined in a portion of the OD region between the gate and the first dummy gate, and wherein a drain for the transistor is defined in a portion of the OD region between the gate and a first side of the second dummy gate. A step 710 comprises forming a first gate-directed local interconnect coupled to a portion of the OD region adjacent a second opposing side of the second dummy gate. Finally, a step 715 comprises forming a first diffusion-directed local interconnect coupled between the first gate-directed interconnect and the second dummy gate. It will be appreciated that analogous formation steps may be performed to create the remaining structures of cells 400, 401, and 500.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof but rather, should be fully commensurate with that of the claims appended hereafter and their functional equivalents.

What is claimed is:

1. A cell comprising:
    a continuous oxide definition (OD) region defined in a substrate;
    a gate for a transistor between a first dummy gate and a second dummy gate, wherein a source for the transistor is defined in a first portion of the continuous OD region between the gate and the first dummy gate, and wherein a drain for the transistor is defined in a second portion of the continuous OD region between the gate and a first side of the second dummy gate;
    a first gate-directed local interconnect coupled to a third portion of the continuous OD region adjacent a second opposing side of the second dummy gate;
    a first diffusion-directed local interconnect configured to couple the first gate-directed local interconnect to the second dummy gate; and
    a first via configured to couple the first diffusion-directed local interconnect to a source voltage interconnect in a metal layer adjacent the substrate.

2. The cell of claim 1, further comprising:
    a second gate-directed local interconnect configured to couple to the first portion of the continuous OD region defining the source; and
    a second diffusion-directed local interconnect configured to couple the first dummy gate to the second gate-directed local interconnect.

3. The cell of claim 2, further comprising a second via configured to couple the second gate-directed local interconnect to a source voltage interconnect in a metal layer adjacent the substrate.

4. The cell of claim 2, wherein the first gate-directed local interconnect and the first diffusion-directed local interconnect are each level 2 local interconnects, the cell further comprising a first level 1 gate-directed local interconnect arranged between the first level 2 gate-directed local interconnect and the third portion of the continuous OD region to couple the first level 2 gate-directed local interconnect to the third portion of the continuous OD region, and wherein the first via is a level 3 local interconnect.

5. The cell of claim 4, wherein the first level 1 gate-directed local interconnect, the first level 2 gate-directed local interconnect, and the first level 2 diffusion-directed local interconnect all comprise tungsten.

6. The cell of claim 4, wherein the first dummy gate, the gate, and the second dummy gate are separated from each other according to a gate pitch.

7. The cell of claim 6, wherein the gate comprises a plurality of gates.

8. The cell of claim 1, wherein the cell is a last cell in an array of cells extending across the continuous OD region, and wherein the continuous OD region extends from a first end to an opposing second end adjacent the third portion of the continuous OD region.

9. The cell of claim 1, wherein the cell is a first cell in an array of cells extending across the continuous OD region, and wherein the continuous OD region extends from a first end adjacent the third portion of the continuous OD region to an opposing second end.

10. The cell of claim 1, further comprising an additional continuous OD region.

11. The cell of claim 1, wherein the cell includes a plurality of transistors.

12. The cell of claim 1, wherein the continuous OD region comprises a PMOS continuous OD region.

13. The cell of claim 1, wherein the continuous OD region comprises an NMOS continuous OD region.

14. A method for forming a cell, comprising:
    forming a continuous oxide definition (OD) region defined in a substrate;
    forming a gate for a transistor arranged according to a gate pitch between a first dummy gate and a second dummy gate, wherein a source for the transistor is defined in a portion of the continuous OD region between the gate and the first dummy gate, and wherein a drain for the transistor is defined in a portion of the continuous OD region between the gate and a first side of the second dummy gate;

forming a first gate-directed local interconnect coupled to a portion of the continuous OD region adjacent a second opposing side of the second dummy gate;

forming a first diffusion-directed local interconnect configured to couple the first gate-directed local interconnect to the second dummy gate; and forming a via configured to couple the first gate-directed local interconnect to a source voltage supply.

* * * * *